United States Patent [19] [11] 3,925,677

Fraser [45] Dec. 9, 1975

[54] PLATINUM OXIDE LITHOGRAPHIC MASKS

[75] Inventor: David Bruce Fraser, Berkeley Heights, N.J.

[73] Assignee: Bell Telephone Laboratories, Incorporated, Murray Hill, N.J.

[22] Filed: Apr. 15, 1974

[21] Appl. No.: 460,756

[52] U.S. Cl. .................. 250/505; 250/514; 96/36.2
[51] Int. Cl.² .................. G21F 5/04
[58] Field of Search ........... 250/320, 323, 475, 473, 250/505, 514; 96/36.2

[56] References Cited

UNITED STATES PATENTS 2,382,674 8/1945 Staud .................. 250/323
3,743,842 7/1973 Smith .................. 250/320

*Primary Examiner*—Craig E. Church
*Attorney, Agent, or Firm*—P. V. D. Wilde

[57] ABSTRACT

Because of the advantages it offers over wet chemical processing, sputter etching is an attractive process for making dimensionally-controlled high-resolution lithographic masks. This process needs a mask material that sputter etches rapidly in relation to the sputter etch resist. We have found that platinum oxide ($Pt_3O_4$) films sputter etch 15× faster than iron oxide films, and are at least as durable and adherent. Because of the relatively high atomic number of platinum, platinum oxide masks are useful in electron beam and X-ray lithography.

4 Claims, 2 Drawing Figures

PLATINUM OXIDE LITHOGRAPHIC MASKS

BACKGROUND OF THE INVENTION

Figure 1:
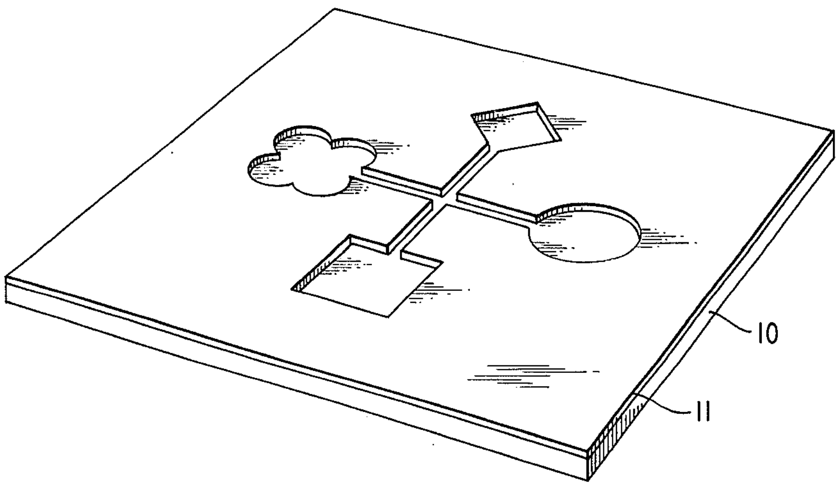

Sputter etching is an attractive means for pattern definition in integrated circuit mask fabrication. In contrast to wet chemical etching, sputter etching is not isotropic and problems associated with undercutting beneath the resist are minimized. However, because the resist material itself is sputtered away during sputter etching, the relative removal rates of the resist and the mask layer are important and are related by the simple expression $$\frac{t_R}{r_R} > \frac{t_M}{r_M}$$

where $t_R$, $t_M$, $r_R$ and $r_M$ are the thicknesses and sputtering rates of the resist layer and mask layer. For high resolution lithography, the mask layer should be very thin because edge distortions, such as diffraction and beam shadowing, increase proportionally with the height of the edge. But it must be thick enough to be opaque to the active radiation. This fixes a minimum for $t_M$ which, for typical hard copy mask materials like chromium and iron oxide, is of the order of one thousand to a few thousand angstroms. When sputter etching the mask pattern, it is desirable to have the resist layer as thin as possible (consistent with low pinhole density) to keep the ratio of resist thickness to the thickness of the minimum feature size as small as practical. Intuitively, one can sense that as the aspect ratio of the grooves in the resist increases the chances decrease of etching through the mask layer reliably and with good definition. Ordinarily, it is advantageous for this aspect ratio to be less than one. If we adopt this as a rule and wish to etch 1.0$\mu$ features, then the resist thickness $t_R$ must be less than 10,000 angstroms.

The sputter etch rate of the resist, $r_R$, is largely fixed due to the relatively limited category of available emulsion materials. A typical sputter etch rate for an exemplary resist, Kodak Microresist 747, was measured at 250 to 500 A per minute.

Inserting the most favorable of these values into the expression developed earlier gives the nominal minimum sputter etch rate, $r_M$, for the mask material:

$$\frac{t_R}{r_R} > \frac{t_M}{r_M}$$

or $$\frac{10{,}000}{250} > \frac{1000}{r_M}$$

$$r_M > 25\ A \text{ per minute.}$$

Under the same sputtering conditions used to measure the etch rate of the resist, chromium mask layers were found to sputter at approximately 15 A per minute, and iron oxide layers at approximately 20 A per minute. For the ground conditions just specified, these materials, the most prominent of the existing hard copy mask materials, are marginal at best.

In addition to meeting a required sputter etch rate, any new mask material should be durable, should adhere well to the substrate, and should have suitable optical properties, i.e., should have opaque to the actinic radiation, and preferably have a "window" in the visible spectrum so that the mask can be visually aligned. (The latter requirement will continue to be useful in terms of the versatility of the mask, but will be less important as new schemes for automatic mask alignment are implemented.)

I have found that masking layers of platinum oxide (corresponding approximately to $Pt_3O_4$) are advantageous from these standpoints. Hard copy platinum oxide masks can be generated, using any lithographic process and can be used to mask all of the important kinds of actinic radiation. Because of the high atomic number of platinum, platinum oxide films are effective masks for electron beam lithography and X-ray lithography.

The following description illustrates in detail the use of platinum oxide.

In the drawing, FIG. 1 is a perspective view of a hard copy mask; and

Figure 2:
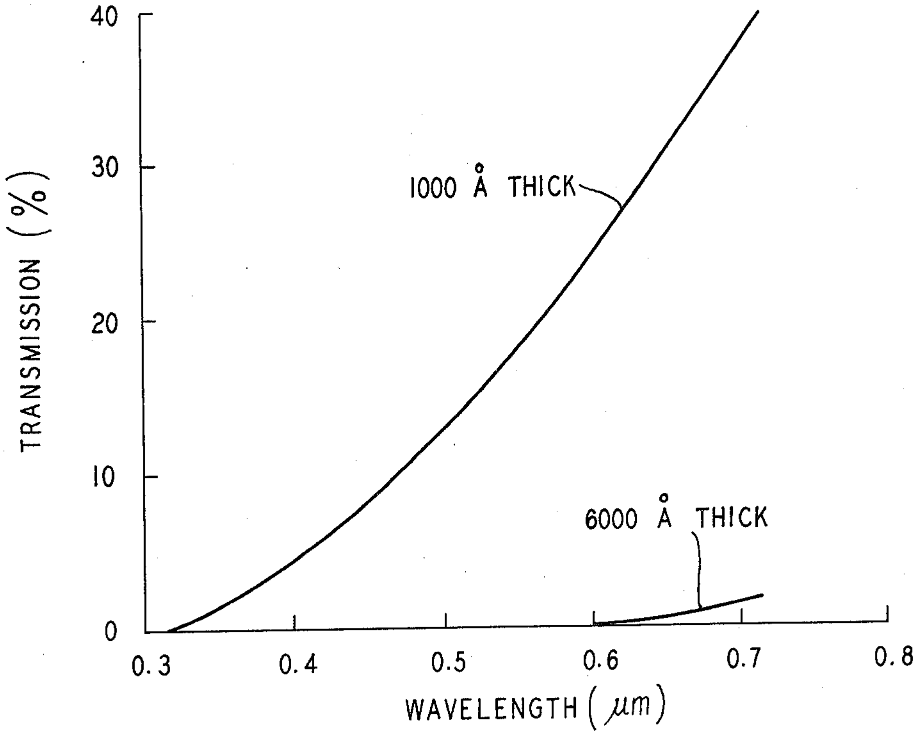

FIG. 2 is a plot or transparency vs. wavelength for two $Pt_3O_4$ mask layer thicknesses.

Platinum oxide masks were evaluated from the standpoints developed above and compared to existing hard copy masks.

Samples of PtO masks were prepared by reactive sputtering, using a platinum metal target, and oxygen as the sputtering gas. The sputtering techniques used were conventional. A description of suitable apparatus and procedures can be found in the "Handbook of Thin Film Technology," Edited by Maissel and Glang, Chapter 4-1, McGraw-Hill (1970). Both rf and dc power sources were used, but the major results reported here were obtained using an rf generator. A minimum deposition rate of 100 A per minute was used to deposit the films. Films up to 8500 A thickness were deposited. although thicker films could be deposited as desired. The films appear brown in thin layers and black in thick layers. The adherence is good and may be enhanced on oxide surfaces by using a thin layer (~100 A) of sputter-deposited indium tin oxide between the platinum oxide and the substrate. This layer can be formed by the technique described in "Highly Conductive, Transparent Films of Sputtered $In_{2-x}Sn_xO_{3-y}$", by D. B. Fraser and H. D. Cook, J. Electrochem. Soc., Vol. 119, p. 1368 (1972).

A photomask for a sample pattern is shown in FIG. 1. The substrate 10 is ordinary glass or it can be a variety of rigid materials which are largely transparent over the range of 3000 to 6000 A. It is also necessary that the surface be smooth and optically flat. Deposited on the substrate 10 is a platinum oxide layer into which the photomask pattern 11 is etched. The thickness of the photomask layer 11 is generally between 1000 A and 10,000 A.

The resistivities of a number of platinum oxide films were measured and found to be in the range 0.1 – 0.2$\Omega$ cm. Electron diffraction permits identification of the sputtered film as $Pt_3O_4$, possibly with some Pt metal grains dispersed through the film. The $Pt_3O_4$ films will tolerate annealing in air at 580°C. without adherence failure.

The same rf sputter station used to deposit the films was also used in the sputter-etch mode of etch the $Pt_3O_4$ films and other mask films for a comparison of etch rates. For a technical discussion of sputter etching, see Chapter 7 of the "Handbook of Thin Film Technology" (referenced above). The results are summarized in Table I. All substrates were placed on a Pyrex cover on the water-cooled electrode. The glass cover was used as a throwaway element in order to keep the electrode and the substrates clean. A variable rate of removal was found for the resist and is indicative that outgassing occurred or a small leak was present in the vacuum system, either of which could contribute $O_2$ or $H_2O$ to the plasma. The values given in Table I are valid for a relative comparison using this vacuum station, but use of other sputter-etch facilities might be expected to affect the rates of removal of the resist and the Cr.

Table I

Comparison of Sputter Etch Rates*

| Material | Etch Rate A/min. |
|---|---|
| Kodak Microresist 747 | 250–500 |
| Pt | 240 |
| $Pt_3O_4$ | 370 |
| Cr | ~15 |
| $Fe_2O_3$ | ~20 |

*All sputter etched with Ar gas at 100 W net forward rf power into tuning network and chamber.

After sputter etching, a plasma stripper (LFE-PDS 302 operated at 350 W for 15 minutes) was used to remove the remaining resist material. It is possible that etching and resist stripping could be combined into a single operation. Initially, the sputter etch could use Ar gas and at the end of this phase of the operation, $O_2$ gas could be admitted and the resist removed by sputter etching before the system was opened.

Durability and adherence were checked on two samples, each of continuous, unpatterned $Fe_2O_3$ and $Pt_3O_4$ on glass substrates. A "Manual Scrape Adhesion Tester" (per MS 17000 sec 1086) was used. The $Pt_3O_4$ film did not show any surface scratching, but did tear away in small areas (likely initiated at film pinholes) for loads of 7.5 Kgm. The $Fe_2O_3$ did show surface scratches for loads of 2.5 Kgm and was scratched through to the glass at loads of 5.0 Kgm.

Some examples of sputter etched $Pt_3O_4$ patterns will be described. The first example is a thin film, 1000 A thick, and the second, a thick film, 6000 A thick. The transmission properties of the films are shown in FIG. 2. Optical transmission through the visible portion of the spectrum is negligible for the thicker film, while that of the thinner film approaches transmission desired in a see-through photolithographic mask material. The opacity of a film also depends on the amount of Pt metal present in the oxide layer so that some control of the absorption at $0.4\mu m$ may also be achieved by a slight reduction of the film.

The films were coated with Kodak microresist 747 which was exposed, processed and then baked at 140°C. for 40 minutes. On the 6000 A thick $Pt_3O_4$ layer, 10,000 A of patterned resist remained; and on the 1000 A thick $Pt_3O_4$ layer, 8000 A of patterned resist remained. With the rf power input to the matching network set at 100 W, the films were sputter etched in an Ar plasma. The sputter etch times were 16 minutes for the 6000 A layer and less than 3 minutes for the 1000 A layer.

Scanning electron micrographs were obtained of the sputter etched patterns after the resist was removed by plasma stripping. The thicker $Pt_3O_4$ film shows good edge resolution in the lower magnification view of the pattern which holds up under higher magnification. The nominal linewidth is $8\mu m$. In the thinner $Pt_3O_4$ film, the edges are well defined at both magnifications.

An added advantage of platinum oxide as a mask material is that it is easily deposited within existing platinum sputter-metallization facilities and requires only that $O_2$ gas rather than Ar be used. Economic considerations also place $Pt_3O_4$ in a very competitive position with both $Fe_2O_3$ or Cr for use in master masks or working copies. Platinum oxide does transmit slightly at the optical wavelengths used for alignment and could also be considered for application as a see-through mask.

As indicated earlier, the high atomic number of Pt suggests that these films may find application in either electron lithography or X-ray lithography. Should additional opacity be required, a patterned $Pt_3O_4$ layer could be plated up with Au.

Various additional modifications and extensions of this invention will become apparent to those skilled in the art. All such variations and deviations which basically rely on the teachings through which this invention has advanced the art are properly considered to be within the spirit and scope of this invention.

What is claimed is:

1. A method for making a lithographic mask comprising the steps of depositing on a rigid transparent substrate a thin film of platinum oxide, applying selectively a sputter etch resist over portions of the platinum oxide thin film to form a positive microcircuit pattern, removing the exposed portions of the platinum oxide thin film by sputter etching, and removing the resist.

2. The method of claim 1 including the additional step of depositing a first thin film of indium tin oxide on the substrate before depositing the thin film of platinum oxide.

3. A lithographic mask comprising a rigid transparent substrate, and a selectively applied pattern of thin platinum oxide formed on the substrate, the pattern having microscopic features suitable for microcircuit lithography.

4. The mask of claim 3 further including a thin film of indium tin oxide interposed between the platinum oxide and the substrate.

* * * * *